United States Patent
Li et al.

(10) Patent No.: US 10,297,454 B2
(45) Date of Patent: May 21, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Feng Lian Li, Shanghai (CN); Jing Hua Ni, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/335,777

(22) Filed: Oct. 27, 2016

(65) Prior Publication Data
US 2017/0162394 A1 Jun. 8, 2017

(30) Foreign Application Priority Data
Dec. 3, 2015 (CN) .......................... 2015 1 0881899

(51) Int. Cl.
| H01L 21/28 | (2006.01) |
| H01L 21/8238 | (2006.01) |
| H01L 29/49 | (2006.01) |
| H01L 29/66 | (2006.01) |
| H01L 29/78 | (2006.01) |

(52) U.S. Cl.
CPC .. *H01L 21/28123* (2013.01); *H01L 21/28088* (2013.01); *H01L 21/823821* (2013.01);
(Continued)

(58) Field of Classification Search
CPC ......... H01L 21/28088; H01L 21/28123; H01L 21/823821; H01L 21/823828;
(Continued)

(56) References Cited

U.S. PATENT DOCUMENTS 6,534,412 B1 3/2003 Lin
7,939,392 B2 5/2011 Chung et al.
(Continued)

*Primary Examiner* — Joseph M Galvin, III
(74) *Attorney, Agent, or Firm* — Anova Law Group, PLLC

(57) ABSTRACT

A method is provided for fabricating a semiconductor device. The method includes providing a base substrate including a dummy gate electrode and an interlayer dielectric layer covering a sidewall of the dummy gate electrode. The method also includes forming a sacrificial layer covering a top surface of the interlayer dielectric layer by using a selective atomic layer deposition process, wherein the sacrificial layer exposes a top surface of the dummy gate electrode. In addition, the method includes forming an opening by using the sacrificial layer as an etch mask to remove the dummy gate electrode, and forming a metal gate electrode on the sacrificial layer and in the opening. Further, the method includes planarizing the metal gate electrode and the sacrificial layer until a top surface of the metal gate electrode is leveled with the top surface of the interlayer dielectric layer.

20 Claims, 13 Drawing Sheets

(52) U.S. Cl.
CPC .. *H01L 21/823828* (2013.01); *H01L 29/4966* (2013.01); *H01L 29/66545* (2013.01); *H01L 29/66795* (2013.01); *H01L 29/7851* (2013.01)

(58) Field of Classification Search
CPC ........... H01L 29/4966; H01L 29/66545; H01L 29/66795; H01L 29/7851
See application file for complete search history.

(56) References Cited

U.S. PATENT DOCUMENTS

| | | | |
|---|---|---|---|
| 8,058,119 | B2 | 11/2011 | Chung et al. |
| 8,546,209 | B1 | 10/2013 | Cheng |
| 2003/0219953 | A1* | 11/2003 | Mayuzumi ........ H01L 21/82345 438/353 |
| 2008/0132050 | A1 | 6/2008 | Lavoie |
| 2010/0087056 | A1* | 4/2010 | Chung .............. H01L 21/28088 438/585 |
| 2011/0298062 | A1* | 12/2011 | Ganguli ............ H01L 21/28079 257/410 |
| 2012/0264281 | A1* | 10/2012 | Chen ............... H01L 21/823437 438/591 |
| 2013/0243956 | A1 | 9/2013 | Ma |
| 2014/0220772 | A1* | 8/2014 | Lakshmanan ..... H01L 21/76856 438/597 |
| 2014/0363971 | A1* | 12/2014 | Matsumoto ............. C23C 16/40 438/653 |
| 2015/0145054 | A1 | 5/2015 | Bu et al. |
| 2015/0206956 | A1 | 7/2015 | Kim et al. |

\* cited by examiner

SEMICONDUCTOR DEVICE AND FABRICATION METHOD THEREOF

CROSS-REFERENCES TO RELATED APPLICATIONS

This application claims the priority of Chinese patent application No. 201510881899.7, filed on Dec. 3, 2015, the entirety of which is incorporated herein by reference.

FIELD OF THE INVENTION

The present invention generally relates to the field of semiconductor manufacturing technology and, more particularly, relates to a semiconductor device and fabrication method thereof.

BACKGROUND

Metal-Oxide-Semiconductor (MOS) transistor is one of the most important components in modern integrated circuits. The basic structure of the MOS transistor includes a semiconductor substrate, a gate structure formed on the semiconductor substrate, a source region formed at one side of the gate structure, and a drain region formed at other side of the gate structure. The gate structure includes a gate dielectric layer formed on the semiconductor substrate, and a gate electrode layer formed on the gate dielectric layer. The source region and the drain region are doped with ions.

With the increasing of integration degree of the MOS transistor, the voltage and current required for operating the MOS transistor continue to reduce, and the switching speed of the transistor accelerates accordingly, thus more requirements of the semiconductor fabrication process are substantially needed. Therefore, high dielectric constant material (high-K material) has been used instead of $SiO_2$ as a gate dielectric layer to better isolate the gate structure and the other parts of the MOS transistor, and to reduce leakage current. At the same time, to be compatible with the high-K (K larger than 3.9) dielectric constant material, metal material has been used instead of the original polysilicon as the gate electrode layer. The high-K gate dielectric layer and the metal gate electrode form a metal gate structure, so as to further reduce the leakage current of the MOS transistor.

A gate-last process is usually used to form the MOS transistor having the metal gate structure. During the gate-last process, a dummy gate structure is first formed on the semiconductor substrate, and an interlayer dielectric layer is formed on the semiconductor substrate at both sides of the dummy gate structure. The top surface of the interlayer dielectric layer is leveled with the top surface of the dummy gate structure. Then the dummy gate electrode is removed, and the metal gate electrode is formed at a position previously defined by the dummy gate electrode.

However, the height of the metal gate electrode cannot be controlled by the existing techniques to form the semiconductor device. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a base substrate including a dummy gate electrode and an interlayer dielectric layer covering a sidewall of the dummy gate electrode. The method also includes forming a sacrificial layer covering a top surface of the interlayer dielectric layer by using a selective atomic layer deposition process, wherein the sacrificial layer exposes a top surface of the dummy gate electrode. In addition, the method includes forming an opening by using the sacrificial layer as an etch mask to remove the dummy gate electrode, and forming a metal gate electrode on the sacrificial layer and in the opening. Further, the method includes planarizing the metal gate electrode and the sacrificial layer until a top surface of the metal gate electrode is leveled with the top surface of the interlayer dielectric layer.

Another aspect of the present disclosure includes another method for fabricating a semiconductor device. The method includes providing a base substrate including a first dummy gate electrode in a first region, a second dummy gate electrode in a second region, and an interlayer dielectric layer formed on sidewalls of the first dummy gate electrode and the second dummy gate electrode, and having a top surface coplanar with the first dummy gate electrode and the second dummy gate electrode. The method also includes forming a first sacrificial layer on a top surface of the interlayer dielectric layer by using a first selective atomic layer deposition process, and forming a first opening by removing the first dummy gate electrode after forming the first sacrificial layer. In addition, the method includes forming a first metal gate electrode on the first sacrificial layer and in the first opening, and planarizing the first metal gate electrode and the first sacrificial layer until a top surface of the first metal gate electrode is leveled with the top surface of the interlayer dielectric layer. Moreover, the method includes forming a second sacrificial layer covering the top surface of the interlayer dielectric layer by using a second selective atomic layer deposition process after planarizing the first metal gate electrode and the first sacrificial layer, and forming a second opening by removing the second dummy gate electrode after forming the second sacrificial layer. Further, the method includes forming a second metal gate electrode on the second sacrificial layer and in the second opening, and planarizing the second metal gate electrode and the second sacrificial layer until a top surface of the second metal gate electrode is leveled with the top surface of the interlayer dielectric layer.

Another aspect of the present disclosure includes a semiconductor device. The semiconductor device includes a substrate, and a metal gate electrode structure on the substrate. The semiconductor device also includes an interlayer dielectric layer on the substrate and covering a sidewall of the metal gate electrode, wherein the metal gate electrode structure is formed by: forming a sacrificial layer covering a top surface of the interlayer dielectric layer by using a selective atomic layer deposition process, wherein the sacrificial layer exposes a top surface of a dummy gate electrode; forming an opening by using the sacrificial layer as an etch mask to remove the dummy gate electrode; forming a metal gate electrode on the sacrificial layer and in the opening; and planarizing the metal gate electrode and the sacrificial layer until a top surface of the metal gate electrode is leveled with the top surface of the interlayer dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Forming the semiconductor device by the existing fabrication process may include proving a base substrate. The base substrate may include a dummy gate electrode, and an interlayer dielectric layer covering the sidewall of the dummy gate electrode. The top surface of the interlayer dielectric layer is leveled with the top surface of the dummy gate electrode. Forming the semiconductor device may also include removing the dummy gate electrode to form an opening, and forming a metal gate electrode on the surface of the interlayer dielectric layer and in the opening. Further, forming the semiconductor device may include planarizing the metal gate electrode using the interlayer dielectric layer as a stop layer.

The process of removing the dummy gate electrode usually includes an etching process, such as a wet etching process, or a dry etching process, etc. Because the interlayer dielectric layer is also exposed to an etching environment when removing the dummy gate electrode, the top surface of the interlayer dielectric layer is damaged by etching, causing the thickness of the interlayer dielectric layer to be decreased and to be changed. The variation of the thickness of the interlayer dielectric layer is uncertain, and the thickness of the interlayer dielectric layer after removing the dummy gate electrode cannot be controlled. After finally forming the metal gate electrode, the top surface of the metal gate electrode is leveled with the top surface of the interlayer dielectric layer. Because the thickness of the interlayer dielectric layer cannot be controlled, the thickness of the metal gate electrode cannot be controlled.

The present disclosure provides a semiconductor device and fabrication process thereof. Before removing the dummy gate electrode, a sacrificial layer covering the top surface of the interlayer dielectric layer may be formed by a selective atomic layer deposition process. The sacrificial layer may only expose the top surface of the dummy gate electrode, and the height of the finally formed metal gate electrode can be controlled.

Figure 22:
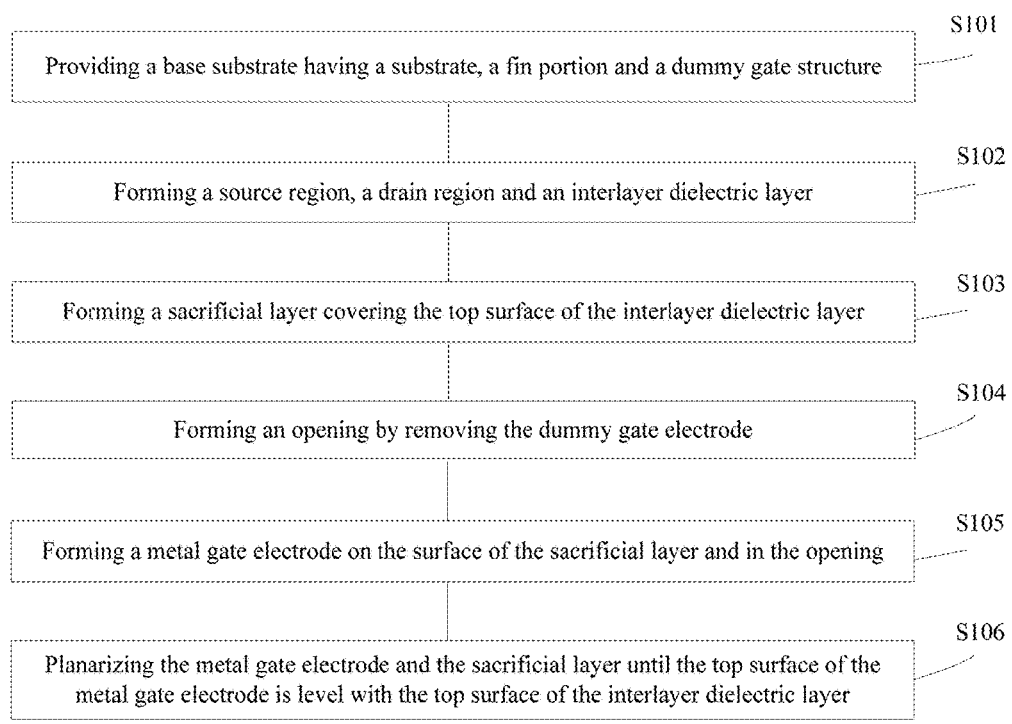
FIG. 22 illustrates an exemplary fabrication process to form a semiconductor device consistent with the disclosed embodiments.

In one embodiment, a semiconductor device configured to form a FinFET is described herein as an example. FIG. 22 illustrates an exemplary fabrication process to form a semiconductor device consistent with the disclosed embodiments; and FIGS. 1-7 illustrate semiconductor structures corresponding to certain stages of the exemplary fabrication process.

Figure 1:
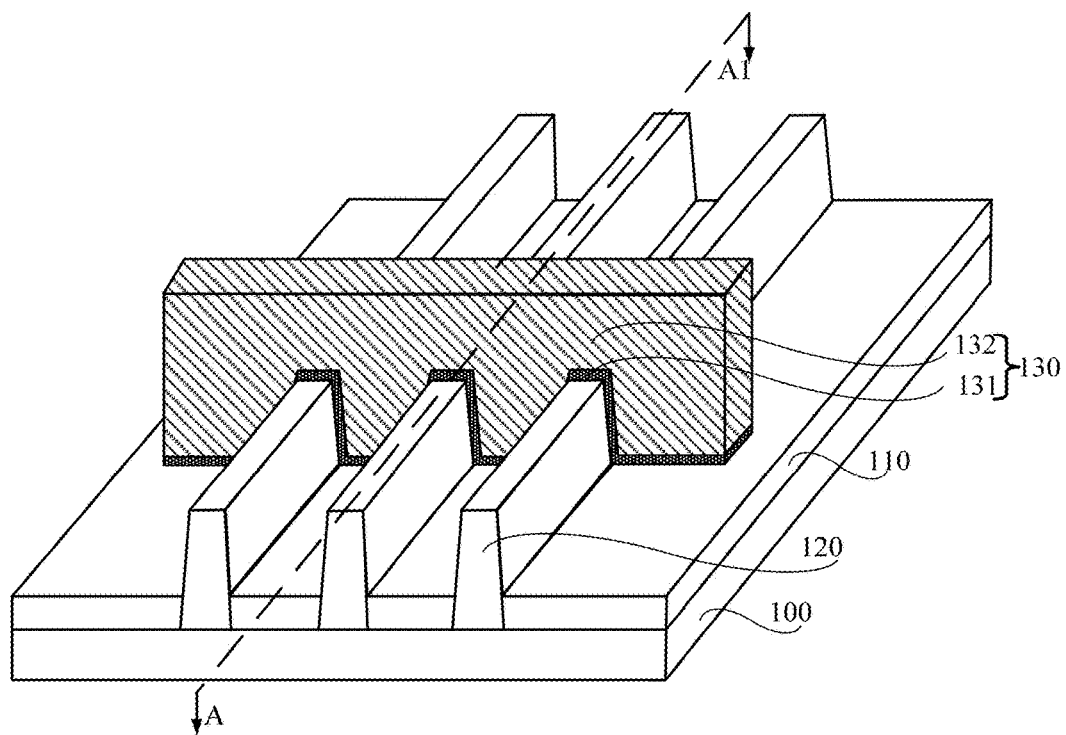
FIGS. 1-7 illustrate semiconductor structures corresponding to certain stages of an exemplary fabrication process to form a semiconductor device consistent with the disclosed embodiments.
Figure 2:
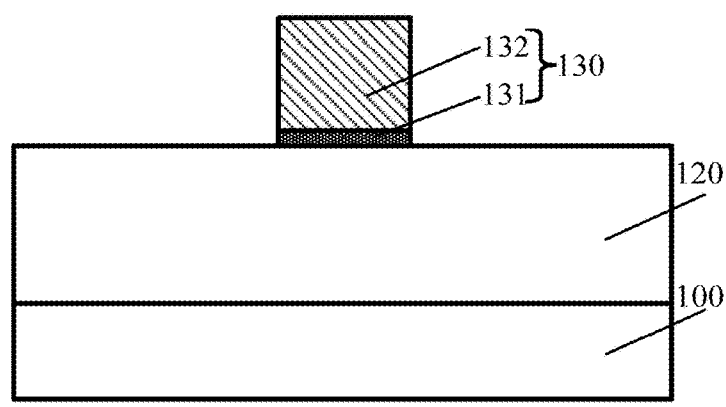

As shown in FIG. 22, at the beginning of the fabrication process, a base substrate with certain structures may be provided (S101). FIGS. 1-2 illustrate a corresponding semiconductor structure.

FIG. 2 is a cross-sectional view along A-A1 direction of the fin portion in FIG. 1. Referring to FIG. 1 and FIG. 2, a base substrate may be provided. The base substrate may include a substrate 100, a fin portion 120 formed on the substrate 100, and a dummy gate structure 130 formed on the fin portion 120 and crossing the fin portion 120. The fin portion 120 may include one or more fins. The dummy gate structure 130 may cover part of top and side surfaces of the fin portion 120.

The substrate 100 may provide a platform for subsequent fabrication processes to form the semiconductor device. The substrate 100 may include monocrystalline silicon, polysilicon, or amorphous silicon. The substrate 100 may also include silicon (Si), germanium (Ge), germanium-silicon alloy (GeSi), silicon carbide (SiC), or gallium arsenide (GaAs) and other Group III-V compounds thereof. In one embodiment, the substrate 100 may be a silicon substrate.

Forming the fin portion 120 may include: forming a patterned mask layer on the substrate 100, where the patterned mask layer may define the position of the fin portion 120; and using the patterned mask layer as a mask to etch the substrate 100 and to remove portions of the substrate 100 to form the fin portion 120. Because the fin portion 120 may be formed by etching the substrate 100, the fin portion 120 and the substrate 100 may be made of the same material. In certain embodiments, the fin portion 120 may be made of different material from the substrate 100.

An isolation structure 110 may also be formed on the substrate 100. The surface of the isolation structure 110 may be lower than the top surface of the fin portion 120. The isolation structure 110 may be configured to electrically isolate the adjacent fins 120. The isolation structure 110 may be made of silicon oxide, or silicon oxynitride, etc.

The dummy gate structure 130 may include a gate dielectric layer 131 crossing the fin portion 120 and a dummy gate electrode 132 covering the gate dielectric layer 131. The gate dielectric layer 131 may be formed on the isolation structure 110, and cover part of top and side surfaces of the fin portion 120. In one embodiment, the gate dielectric layer 131 may be made of silicon oxide, and the dummy gate electrode 132 may be made of polysilicon.

Figure 3:
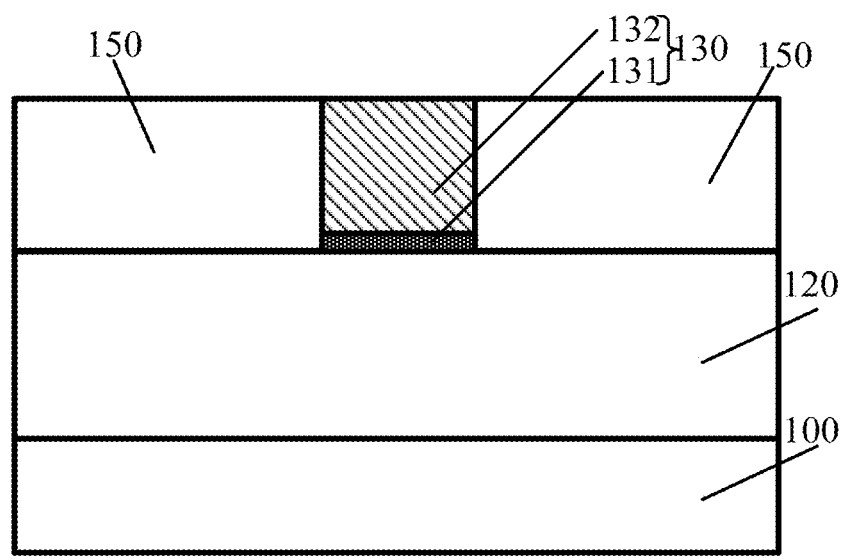

Returning to FIG. 22, after forming the base substrate, a source region, a drain region and an interlayer dielectric layer may be formed (S102). FIG. 3 illustrates a corresponding semiconductor structure.

A source region (not labeled) and a drain region (not labeled) may be formed. The source region may be formed in the fin portion 120 at one side of the dummy gate structure 130, and the drain region may be formed in the fin portion 120 at other side of the dummy gate structure 130. After forming the source region and the drain region, an interlayer dielectric layer 150 may be formed on the base substrate, as shown in FIG. 3. The interlayer dielectric layer 150 may cover the sidewall of the dummy gate structure 130, and the top surface of the interlayer dielectric layer 150 may be leveled with the top surface of the dummy gate structure 130. The interlayer dielectric layer 150 may be made of silicon oxide, silicon oxynitride, or silicon oxycarbide, etc.

Forming the interlayer dielectric layer 150 may include forming an interlayer dielectric material layer covering the fin portion 120, the dummy gate structure 130, the isolation structure 110, and the substrate 100. The entire top surface of the interlayer dielectric material layer may be higher than the top surface of the dummy gate structure 130. Forming the interlayer dielectric layer 150 may also include planarizing the interlayer dielectric material layer until the top surface of the dummy gate structure 130 is exposed to form the interlayer dielectric layer 150.

Because the dummy gate electrode 132 may be made of polysilicon, the top surface of the dummy gate electrode 132 may be easily oxidized in the process environment, resulting in the formation of a silicon oxide layer on the top surface of the dummy gate electrode 132. The difference in the conductivity of the silicon oxide layer and the conductivity of the interlayer dielectric layer 150 may be relatively small. If an atomic layer deposition process is directly performed on the surface of the interlayer dielectric layer 150 to form a sacrificial layer, correspondingly, the sacrificial layer may also be formed on the top surface of the dummy gate electrode 132. The selectivity of forming the sacrificial layer on the top surface of the interlayer dielectric layer 150 and the top surface of the dummy gate electrode 132 may be small.

Figure 4:
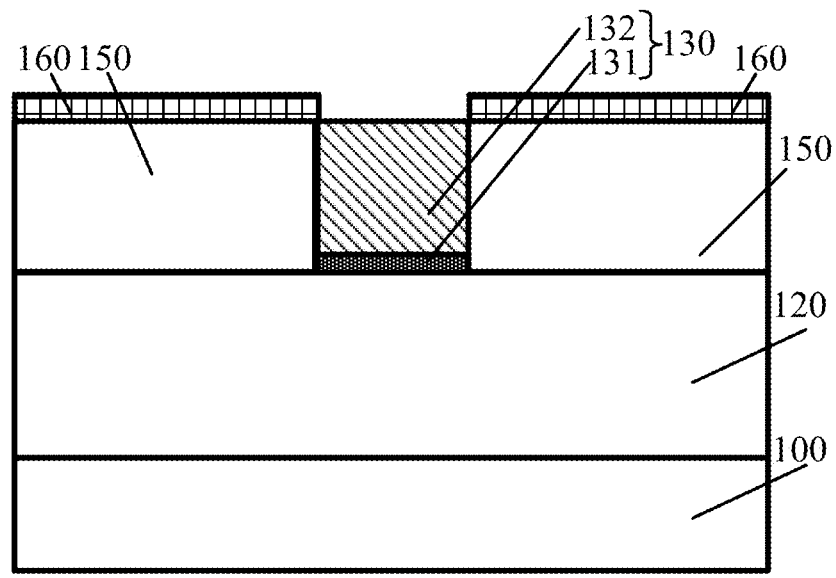

Returning to FIG. 22, after forming the interlayer dielectric layer, a sacrificial layer may be formed (S103). FIG. 4 illustrates a corresponding semiconductor structure.

Referring to FIG. 4, a sacrificial layer 160 covering the top surface of the interlayer dielectric layer 150 may be formed by using a selective atomic layer deposition process. The sacrificial layer 160 may be made of tantalum nitride, or cobalt nitride, etc.

The selective atomic layer deposition process may include multiple atomic layer deposition cycles to achieve the desired thickness of the sacrificial layer 160 to be formed on the interlayer dielectric layer 150. To simplify the description, only one atomic layer deposition cycle is described herein. The atomic layer deposition cycle may include performing a hydrogen radical treatment on the interlayer dielectric layer 150 and the dummy gate electrode 132. After the hydrogen radical treatment, the atomic layer deposition cycle may also include introducing a precursor into the reaction chamber to be reacted to form the sacrificial layer 160 on the interlayer dielectric layer 150. The sacrificial layer 160 may expose the top surface of the dummy gate electrode 132. Further, the atomic layer deposition cycle may include removing the by-products after the reaction.

Because the hydrogen radical treatment is used, the hydrogen radical may be adsorbed on the top surface of the dummy gate electrode 132. Because of the strong oxidation resistance of the hydrogen radical, the top surface of the dummy gate electrode 132 may not be easily oxidized in the process environment, it is difficult to form the non-conductive silicon oxide layer on the top surface of the dummy gate electrode 132. Therefore, the top surface of the dummy gate electrode 132 and the top surface of the interlayer dielectric layer 150 may exhibit different electrical conductivities, and the formed sacrificial layer 160 may be selectively deposited. Specifically, suitable precursor material may be used. The precursor may be easily adsorbed on the top surface of the interlayer dielectric layer 150 and reacted to form the sacrificial layer 160. During each selective atomic layer deposition reaction, by controlling the thickness of the formed sacrificial layer 160, the sacrificial layer 160 may not be formed on the top surface of the dummy gate electrode 132 when forming the sacrificial layer 160 on the top surface of the interlayer dielectric layer 150. Therefore, the sacrificial layer 160 with a desired thickness can be selectively formed on the top surface of the interlayer dielectric layer 150, instead of being formed on the top surface of the dummy gate electrode 132.

The parameters of the hydrogen radical treatment may include the following. The gas used may include methane, or hydrogen, etc; and the process temperature may be in a range of approximately 50° C.-400° C. If the time of the hydrogen radical treatment is too short, the top surface of the interlayer dielectric layer 150 and the top surface of the dummy gate electrode 132 may exhibit small difference in electrical conductivity after the hydrogen radical treatment. The selectivity of forming the sacrificial layer 160 on the top surface of the interlayer dielectric layer 150 may decrease. If the time of the hydrogen radical treatment is too long, the process cost may be increased. Therefore, in one embodiment, the time of the hydrogen radical treatment may be in a range of approximately 5 seconds-40 seconds.

The process of forming the sacrificial layer 160 on the interlayer dielectric layer 150 by introducing the precursor into the reaction chamber to be reacted may include: proving the precursor including a first precursor and a second precursor; first introducing the first precursor into the reaction chamber, where the first precursor may be adsorbed on the interlayer dielectric layer 150; removing the excess first precursor in the chamber; then introducing the second precursor into the reaction chamber, where the second precursor may be reacted with the first precursor to form the sacrificial layer 160; and removing the by-products including the remaining second precursor, the product formed by reaction of the second precursor and the first precursor after the reaction.

When the sacrificial layer 160 is made of tantalum nitride, the reaction parameters of the precursor may include the following. The first precursor used may be $NH_3$, the second precursor used may be $Ta(NMe_2)_5$ (pentyl (Methylamino) tantalum, PDMAT), the temperature may be in a range of approximately 100° C.-300° C., and the chamber pressure may be in a range of approximately 1 Torr-10 Torr.

When the sacrificial layer 160 is made of cobalt nitride, the reaction parameters of the precursor may include the following. The first precursor used may be $C_7H_5CoO_2$ (dicarbonyl cyclopentadienyl cobalt), the second precursor used may be $NH_3$, the temperature may be in a range of approximately 100° C.-300° C., and the chamber pressure may be in a range of approximately 1 Torr-10 Torr.

The thickness of the sacrificial layer 160 should be in a suitable range. If the thickness of the sacrificial layer is less than 20 Å, the protective effect of the sacrificial layer 160 on the interlayer dielectric layer 150 may be reduced, causing a portion of the sacrificial layer 160 to be etched through, and that the interlayer dielectric layer 150 under the sacrificial layer 160 are damaged by the etching when subsequently removing the dummy gate electrode 132. In this case, the height of a portion of the interlayer dielectric layer 150 may be changed, causing the height of the subsequently formed metal gate electrode to be ineffectively controlled. If the thickness of the sacrificial layer 160 is larger than 100 Å, the process cost may be increased. Therefore, the thickness of the sacrificial layer 160 may be in a range of approximately 20 Å-100 Å.

In certain embodiments, a sidewall spacer may be formed on the sidewall of the dummy gate structure 130. The interlayer dielectric layer 150 may also cover the sidewall of the sidewall spacer, and the formed sacrificial layer 160 may also cover the top surface of the sidewall spacer. During the hydrogen radical treatment of forming the sacrificial layer 160, the hydrogen radical treatment may also be performed on the top surface of the sidewall spacer.

Figure 5:
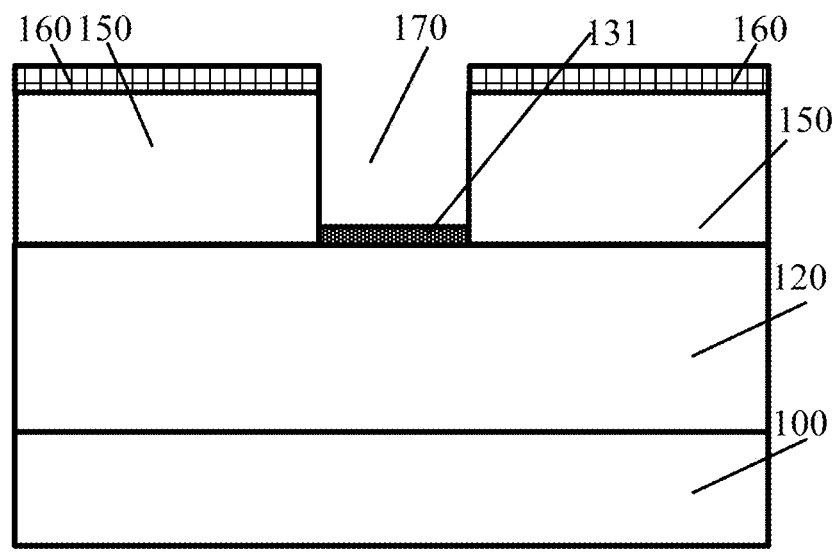

Returning to FIG. 22, after forming the sacrificial layer, an opening may be formed (S104). FIG. 5 illustrates a corresponding semiconductor structure.

Referring to FIG. 5, an opening 170 may be formed by using the sacrificial layer 160 as a mask to remove the dummy gate electrode 132 (shown in FIG. 4). The dummy gate electrode 132 may be removed by using a dry etching process, or a wet etching process, etc.

Figure 6:
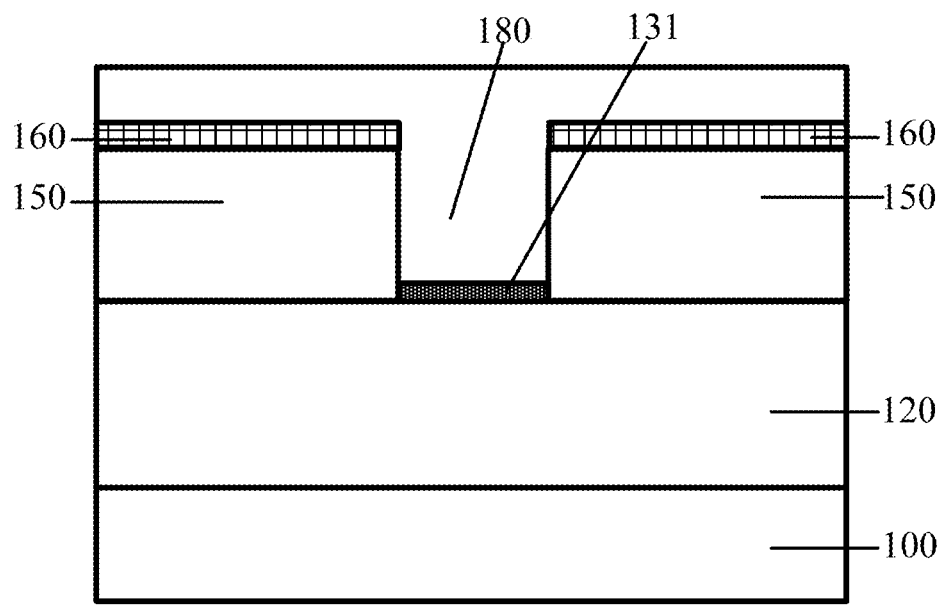

Returning to FIG. 22, after forming the opening, a metal gate electrode may be formed (S105). FIG. 6 illustrates a corresponding semiconductor structure.

Referring to FIG. 6, a metal gate electrode 180 may be formed on the sacrificial layer 160 and in the opening 170. The metal gate electrode 180 may be made of a metal, including one of more of W, Al, Ti, Cu, Mo, and Pt. The process of forming the metal gate electrode 180 may be a deposition process, or an electroplating process, etc. The entire surface of the metal gate electrode 180 may be higher than the surface of the sacrificial layer 160.

Figure 7:
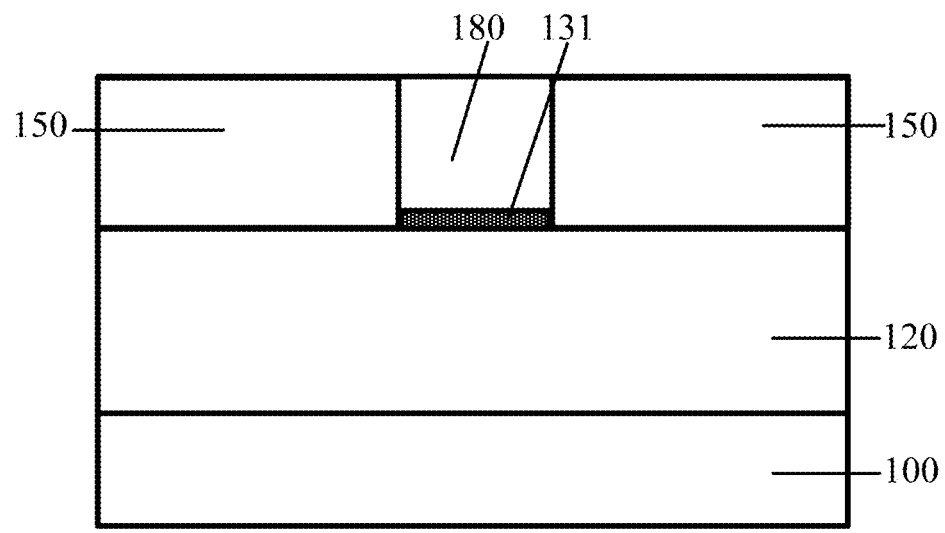

Returning to FIG. 22, after forming the metal gate electrode, the metal gate electrode and the sacrificial layer may be planarized (S106). FIG. 7 illustrates a corresponding semiconductor structure.

Referring to FIG. 7, the metal gate electrode 180 and the sacrificial layer 160 may be planarized until the top surface of the metal gate electrode 180 is leveled with the top surface of the interlayer dielectric layer 150. The process of planarizing the metal gate electrode 180 and the sacrificial layer 160 may be a chemical mechanical polishing process.

In one embodiment, before forming the metal gate electrode 180, optionally, a barrier layer (not labeled) covering the gate dielectric layer 131 and a working function layer (not labeled) covering the barrier layer may be formed.

Figure 23:
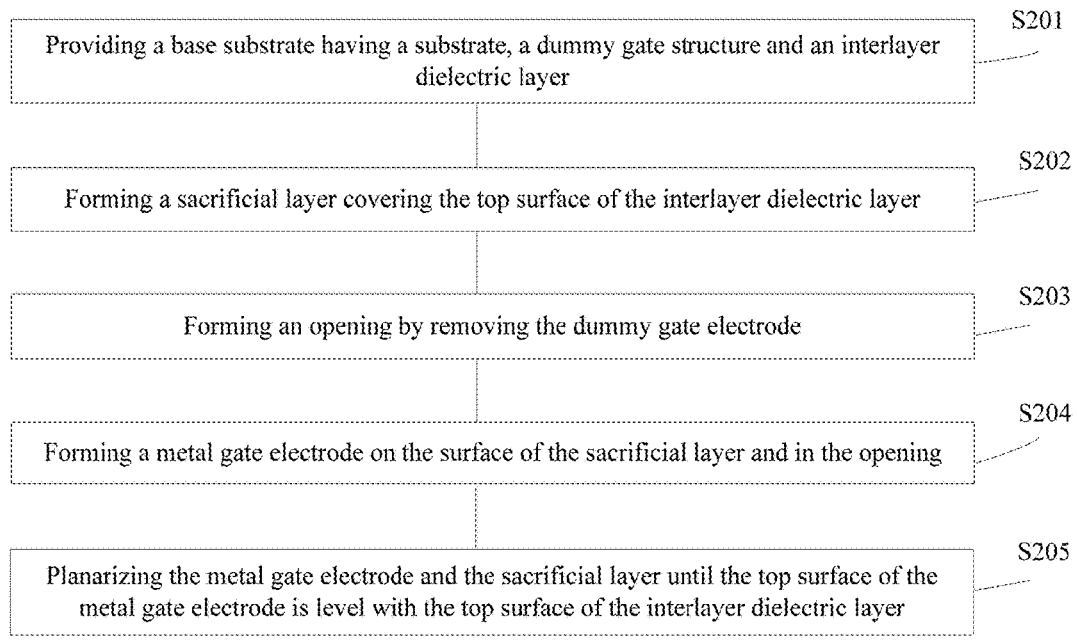
FIG. 23 illustrates another exemplary fabrication process to form a semiconductor device consistent with the disclosed embodiments.

In another embodiment, a semiconductor device configured to form a planar MOS transistor is described herein as an example. FIG. 23 illustrates another exemplary fabrication process to form a semiconductor device consistent with the disclosed embodiments; and FIGS. 8-12 illustrate semiconductor structures corresponding to certain stages of the exemplary fabrication process.

Figure 8:
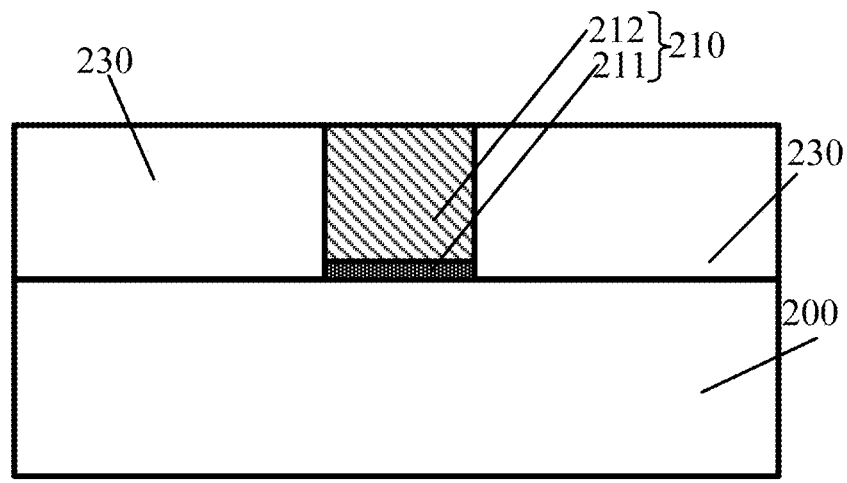
FIGS. 8-12 illustrate semiconductor structures corresponding to certain stages of another exemplary fabrication process to form a semiconductor device consistent with the disclosed embodiments.

As shown in FIG. 23, at the beginning of the fabrication process, a base substrate with certain structures may be formed (S201). FIG. 8 illustrates a corresponding semiconductor structure.

Referring to FIG. 8, a base substrate may be provided. The base substrate may include a substrate 200, a dummy gate structure 210 and an interlayer dielectric layer 230 covering the sidewall of the dummy gate structure 210 and formed on the substrate 200. The top surface of the interlayer dielectric layer 230 may be leveled with the top surface of the dummy gate structure 210.

In one embodiment, after forming the dummy gate structure 210, a source region (not labeled) and a drain region (not labeled) may be formed. The source region may be formed in the substrate 200 at one side of the dummy gate structure 210, and the drain region may be formed in the substrate 200 at other side of the dummy gate structure 210. Then, the interlayer dielectric layer 230 may be formed.

The dummy gate structure 210 may include a gate dielectric layer 211 formed on the substrate 200 and a dummy gate electrode 212 formed on the gate dielectric layer 211. The gate dielectric layer 211 may be made of silicon oxide, and the dummy gate electrode 212 may be made of polysilicon. The method of forming the dummy gate structure 210 and the interlayer dielectric layer 230 can be referred to the above-described embodiment.

Figure 9:
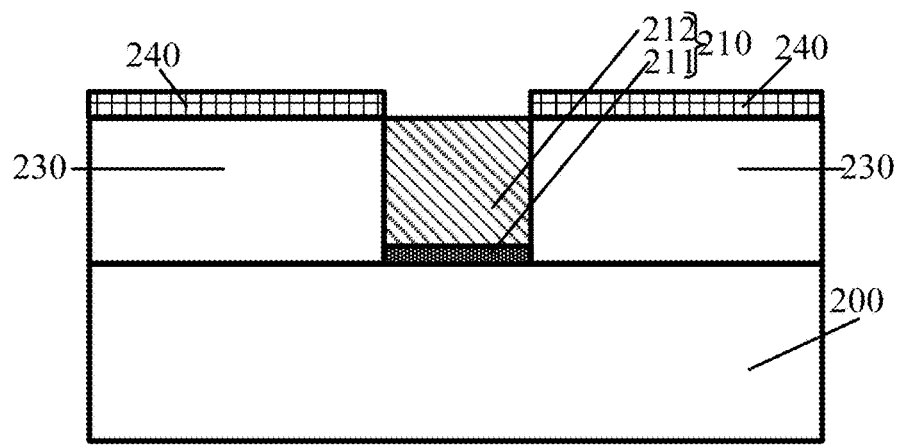

Returning to FIG. 23, after providing the base substrate, a sacrificial layer may be formed (S202). FIG. 9 illustrates a corresponding semiconductor structure.

Referring to FIG. 9, a sacrificial layer 240 covering the top surface of the interlayer dielectric layer 230 may be formed by using a selective atomic layer deposition process. The sacrificial layer 240 may be made of tantalum nitride, or cobalt nitride, etc. The thickness of the sacrificial layer 240 may be in a range of approximately 20 Å-100 Å.

The selective atomic layer deposition process configured to form the sacrificial layer 240 may include multiple atomic layer deposition cycles to achieve the desired thickness of the sacrificial layer 240 to be formed on the interlayer dielectric layer 230. To simplify the description, only one atomic layer deposition cycle is described herein. The atomic layer deposition cycle may include performing a hydrogen radical treatment on the interlayer dielectric layer 230 and the dummy gate electrode 212. After the hydrogen radical treatment, the atomic layer deposition cycle may also include introducing a precursor into the reaction chamber to be reacted to form the sacrificial layer 240 on the interlayer dielectric layer 230. The sacrificial layer 240 may expose the top surface of the dummy gate electrode 212. Further, the atomic layer deposition cycle may include removing the by-products after the reaction.

The parameters of the hydrogen radical treatment can be referred to the above-described embodiment and are not repeated herein. The process and parameters of the reaction of the precursor configured to form the sacrificial layer 240 can also be referred to the above-described embodiment and are not repeated herein.

In certain embodiments, a sidewall spacer may be formed on the sidewall of the dummy gate structure 210. The interlayer dielectric layer 230 may also cover the sidewall of the sidewall spacer, and the formed sacrificial layer 240 may also cover the top surface of the sidewall spacer. During the hydrogen radical treatment of forming the sacrificial layer 240, the hydrogen radical treatment may also be performed on the top surface of the sidewall spacer.

Figure 10:
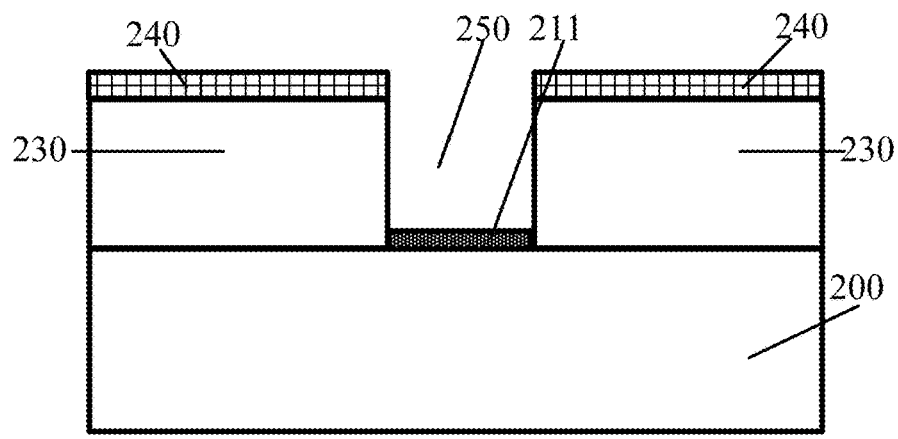

Returning to FIG. 23, after forming the sacrificial layer, an opening may be formed (S203). FIG. 10 illustrates a corresponding semiconductor structure.

Referring to FIG. 10, an opening 250 may be formed by using the sacrificial layer 240 as a mask to remove the dummy gate electrode 212 (shown in FIG. 9). The method of removing the dummy gate electrode 212 can be referred to the process of removing the dummy gate electrode 132 in the above-described embodiment and is not repeated herein.

Figure 11:
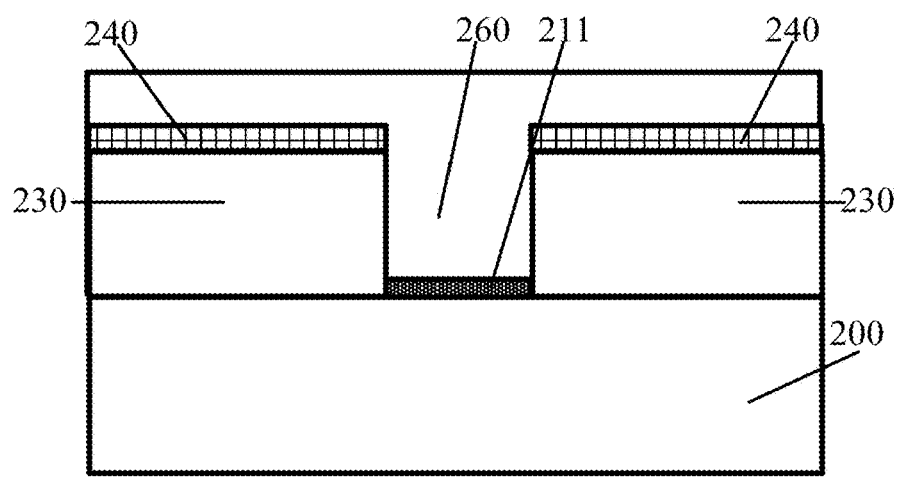

Returning to FIG. 23, after forming the opening, a metal gate electrode may be formed (S204). FIG. 11 illustrates a corresponding semiconductor structure.

Referring to FIG. 11, a metal gate electrode 260 may be formed on the sacrificial layer 240 and in the opening 250. The method of forming the metal gate electrode 260 can be referred to the process of forming the metal gate electrode 180 in the above-described embodiment and is not repeated herein.

Figure 12:
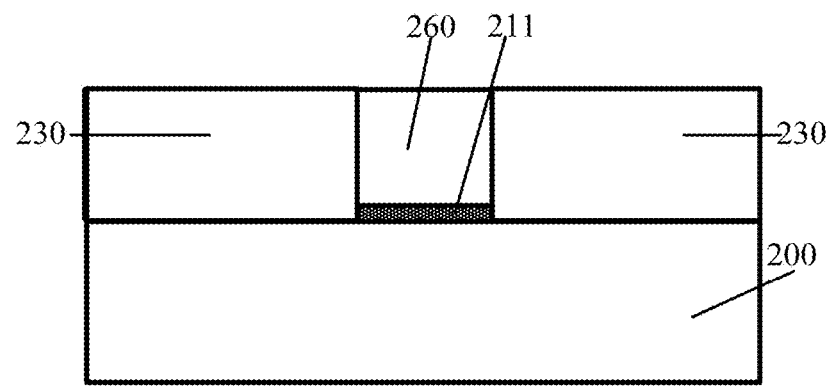

Returning to FIG. 23, after forming the metal gate electrode, the metal gate electrode and the sacrificial layer may be planarized (S205). FIG. 12 illustrates a corresponding semiconductor structure.

Referring to FIG. 12, the metal gate electrode 260 and the sacrificial layer 240 may be planarized until the top surface of the metal gate electrode 260 is leveled with the top surface of the interlayer dielectric layer 230. The process of planarizing the metal gate electrode 260 and the sacrificial layer 240 may be a chemical mechanical polishing process.

In one embodiment, before forming the metal gate electrode 260, optionally, a barrier layer (not labeled) covering the gate dielectric layer 211 and a working function layer (not labeled) covering the barrier layer may be formed.

In the above-described embodiments described in FIGS. 1-7 and FIGS. 8-12, because the sacrificial layer covering the top surface of the interlayer dielectric layer may be formed by using the selective atomic layer deposition process, the sacrificial layer may only expose the top surface of the dummy gate electrode. Therefore, during the process of removing the dummy gate electrode, the sacrificial layer can protect the top surface of the interlayer dielectric layer from being damaged by the etching, so as to prevent the height of the interlayer dielectric layer from being decreased and changed during the process of removing the dummy gate electrode. After planarizing the metal gate electrode and the sacrificial layer, the top surface of the metal gate electrode may be leveled with the top surface of the interlayer dielectric layer. Because the height of the interlayer dielectric layer may not be changed, the height of the metal gate electrode may not be changed either. Therefore, the height of the finally formed metal gate electrode can be controlled. In addition, the selective atomic layer deposition process is performed to form the sacrificial layer. Forming the sacrificial layer on the top surface of the interlayer dielectric layer and not forming the sacrificial layer on the top surface of the dummy gate electrode can be achieved in one single process step, simplifying the process of forming the sacrificial layer.

Figure 24:
FIG. 24 illustrates another exemplary fabrication process to form a semiconductor device consistent with the disclosed embodiments.

In another embodiment, a semiconductor device configured to form two planar MOS transistors is described herein as an example. FIG. 24 illustrates another exemplary fabrication process to form a semiconductor device consistent with the disclosed embodiments; and FIGS. 13-21 illustrate semiconductor structures corresponding to certain stages of the exemplary fabrication process.

Figure 13:
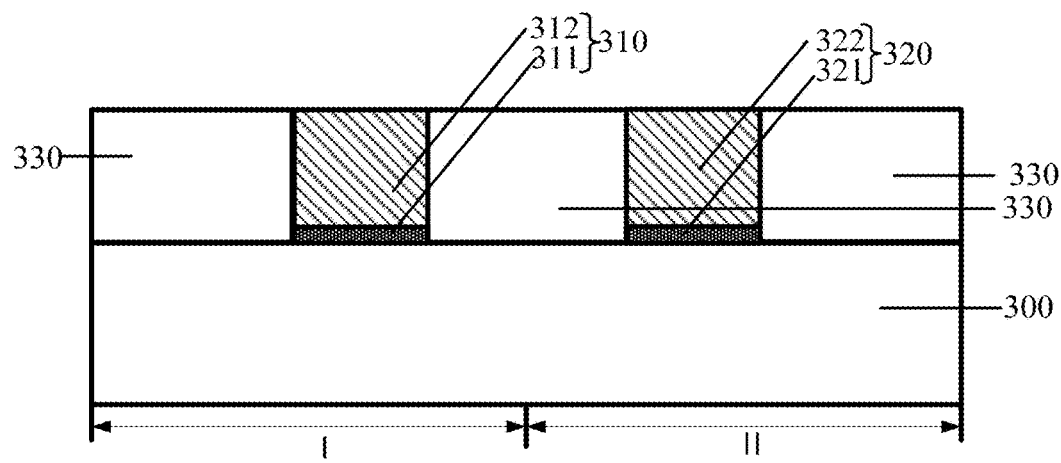
FIGS. 13-21 illustrate semiconductor structures corresponding to certain stages of another exemplary fabrication process to form a semiconductor device consistent with the disclosed embodiments.

As shown in FIG. 24, at the beginning of the fabrication process, a base substrate with certain structures may be formed (S301). FIG. 13 illustrates a corresponding semiconductor structure.

Referring to FIG. 13, a base substrate 300 may be provided. The base substrate may include a first region (I region) and a second region (II region). A first dummy gate structure 310 may be formed on the base substrate 300 in the first region, and a second dummy gate structure 320 may be formed on the base substrate 300 in the second region. An interlayer dielectric layer 330 covering the sidewall of the first dummy gate structure 310 and the sidewall of the second dummy gate structure 320 may be formed on the base substrate 300. The top surface of the interlayer dielectric layer 330 may be leveled with the top surfaces of the first dummy gate structure 310 and the second dummy gate structure 320.

The first region may be a P-type region, and the second region may be an N-type region. Or the first region may be an N-type region, and the second region may be a P-type region. A P-type MOS transistor may be formed in the P-type region, and an N-type MOS transistor may be formed in the N-type region.

The first dummy gate structure 310 may include a first gate dielectric layer 311 formed on the base substrate 300 in the first region, and a first dummy gate electrode 312 formed on the first gate dielectric layer 311. The second dummy gate structure 320 may include a second gate dielectric layer 321 formed on the base substrate 300 in the second region, and a second dummy gate electrode 322 formed on the second gate dielectric layer 321.

Forming the first dummy gate structure 310 and the second dummy gate structure 320 may include: sequentially forming a gate dielectric material layer on the base substrate 300 and a dummy gate electrode material layer on the gate dielectric material layer; forming a patterned mask layer on the dummy gate electrode material layer, configured to define the first dummy gate structure 310 and the second dummy gate structure 320; and using the mask layer as a mask to sequentially etch the dummy gate electrode material layer and the gate dielectric material layer to form the first dummy gate structure 310 and the second dummy gate structure 320. In one embodiment, the first gate dielectric layer 311 and the second gate dielectric layer 321 may be made of silicon oxide. The first dummy gate electrode 312 and the second dummy gate electrode 322 may be made of polysilicon.

After forming the first dummy gate structure 310 and the second dummy gate structure 320, first source and drain regions may be formed in the base substrate 300 at both sides of the first dummy gate structure 310. Second source and drain regions may be formed in the base substrate 300 at both sides of the second dummy gate structure 320. Then, the interlayer dielectric layer 330 may be formed.

The interlayer dielectric layer 330 may be made of silicon oxide, silicon oxynitride, or silicon oxycarbide, etc. Forming the interlayer dielectric layer 330 may include forming an interlayer dielectric material layer to cover the first dummy gate structure 310 and the second dummy gate structure 320. The entire surface of the interlayer dielectric material layer may be higher than the top surfaces of the first dummy gate structure 310 and the second dummy gate structure 320. Forming the interlayer dielectric layer 330 may also include planarizing the interlayer dielectric material layer until the top surfaces of the first dummy gate structure 310 and the second dummy gate structure 320 are exposed to form the interlayer dielectric layer 330.

Figure 14:
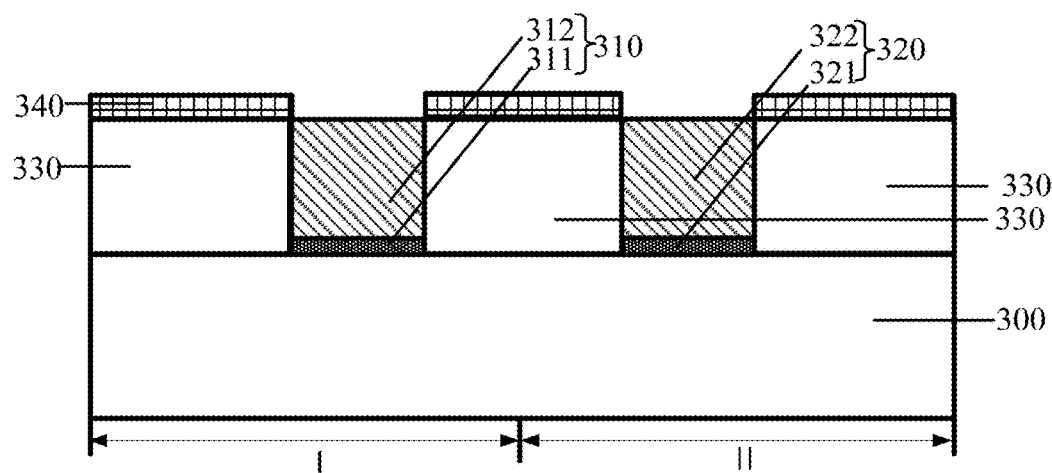

Returning to FIG. 24, after providing the base substrate, a first sacrificial layer may be formed (S302). FIG. 14 illustrates a corresponding semiconductor structure.

Referring to FIG. 14, a first sacrificial layer 340 may be formed on the top surface of the interlayer dielectric layer 330 by using a selective atomic layer deposition process. The first sacrificial layer 340 may be made of tantalum nitride, or cobalt nitride, etc, and the thickness of the first sacrificial layer 340 may be in a range of approximately 20 Å-100 Å.

The selective atomic layer deposition process configured to form the first sacrificial layer 340 may include multiple atomic layer deposition cycles to achieve the desired thickness of the first sacrificial layer 340 formed on the interlayer dielectric layer 330. To simplify the description, only one atomic layer deposition cycle is described herein. The atomic layer deposition cycle may include performing a hydrogen radical treatment on the interlayer dielectric layer 330, the first dummy gate electrode 312 and the second dummy gate electrode 322. After the hydrogen radical treatment, the atomic layer deposition cycle may also include introducing a precursor into the reaction chamber to be reacted to form the first sacrificial layer 340 on the interlayer dielectric layer 330. Further, the atomic layer deposition cycle may include removing the by-products after the reaction.

The parameters of the hydrogen radical treatment may include as following. The gas used may be methane, or hydrogen, etc, the process temperature may be in a range of approximately 50° C.-400° C., and the time may be in a range of approximately 5 seconds-40 seconds.

The process of forming the first sacrificial layer 340 on the interlayer dielectric layer 330 by introducing the precursor into the reaction chamber to be reacted may include: providing the precursor including a first precursor and a second precursor; first introducing the first precursor into the reaction chamber, where the first precursor may be adsorbed on the interlayer dielectric layer 330; removing the excess first precursor in the chamber; then introducing the second precursor into the reaction chamber, where the second precursor may be reacted with the first precursor to form the first sacrificial layer 340; and removing the by-products including the remaining second precursor, the product formed by reaction of the second precursor and the first precursor after the reaction.

When the first sacrificial layer 340 is made of tantalum nitride, the reaction parameters of the precursor may include the following. The first precursor used may be $NH_3$, the second precursor used may be $Ta(NMe_2)_5$, the temperature may be in a range of approximately 100° C.-300° C., and the chamber pressure may be in a range of approximately 1 Torr-10 Torr.

When the first sacrificial layer 340 is made of cobalt nitride, the reaction parameters of the precursor may include as following. The first precursor used may be $C_7H_5CoO_2$, the second precursor used may be $NH_3$, the temperature may be in a range of approximately 100° C.-300° C., and the chamber pressure may be in a range of approximately 1 Torr-10 Torr.

Figure 15:
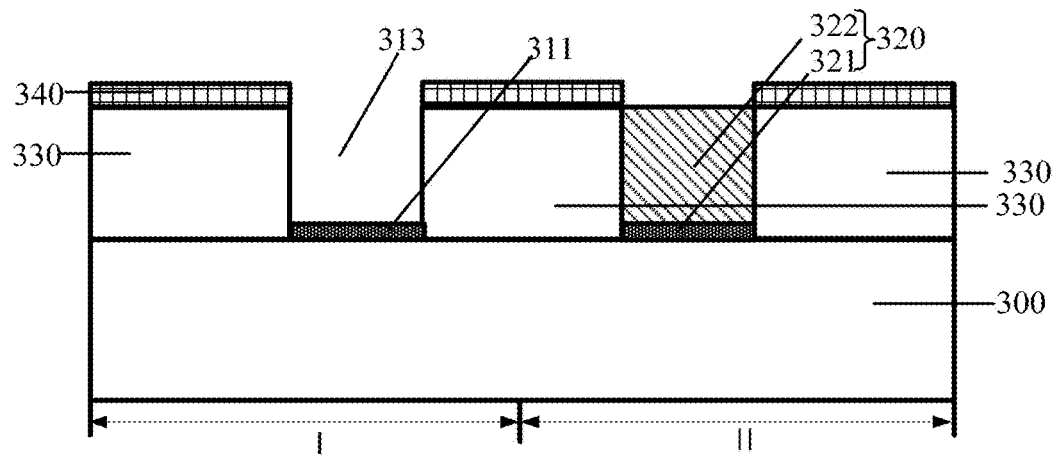

Returning to FIG. 24, after forming the first sacrificial layer, a first opening may be formed (S303). FIG. 15 illustrates a corresponding semiconductor structure.

Referring to FIG. 15, after forming the first sacrificial layer 340, a first opening 313 may be formed by removing the first dummy gate electrode 312. The process of removing the first dummy gate electrode 312 may be a dry etching process, or a wet etching process, etc.

Figure 16:
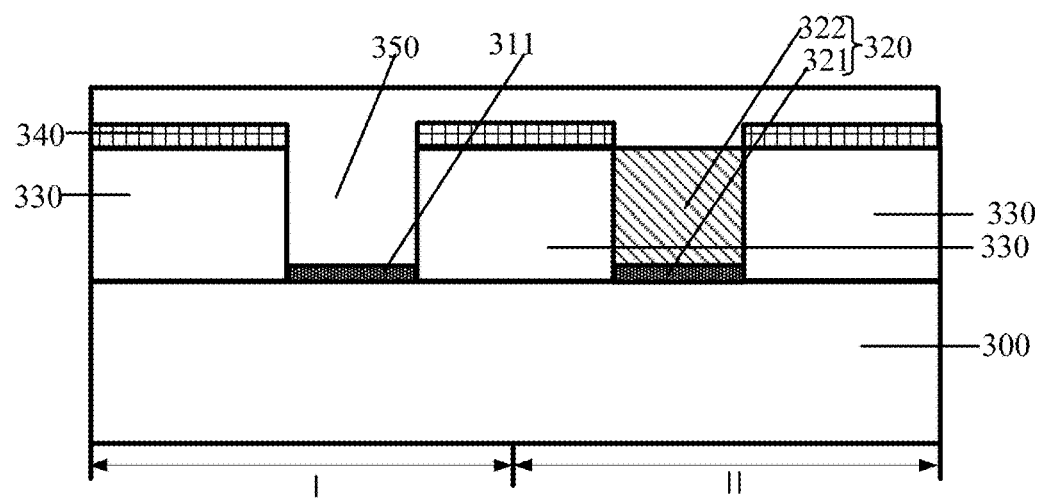

Returning to FIG. 24, after forming the first opening, a first metal gate electrode may be formed (S304). FIG. 16 illustrates a corresponding semiconductor structure.

Referring to FIG. 16, a first metal gate electrode 350 may be formed on the first sacrificial layer 340 and in the first opening 313 (shown in FIG. 15). The first metal gate electrode 350 may be made of metal, including one or more of W, Al, Ti, Cu, Mo, and Pt. The process of forming the first metal gate electrode 350 may be a deposition process, or an electroplating process, etc. The entire surface of the first metal gate electrode 350 may be higher than the top surface of the first sacrificial layer 340.

Figure 17:
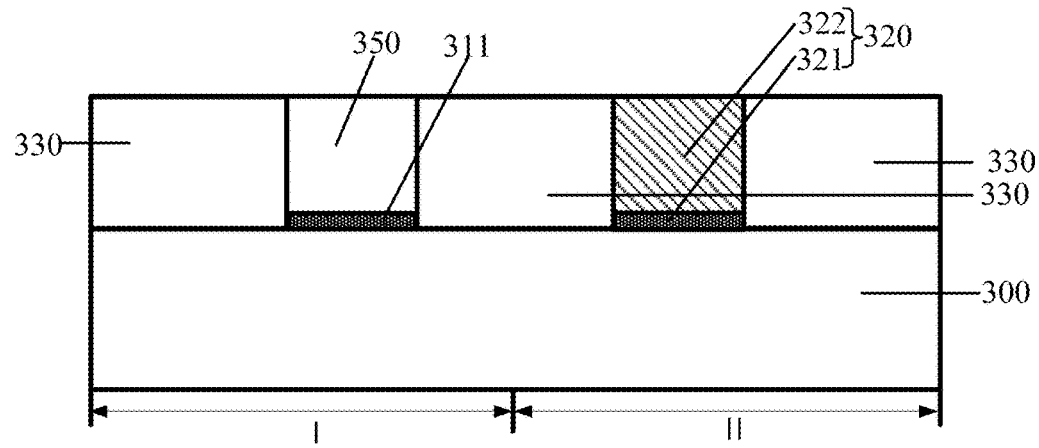

Returning to FIG. 24, after forming the first metal gate electrode, the first metal gate electrode and the first sacrificial layer may be planarized (S305). FIG. 17 illustrates a corresponding semiconductor structure.

Referring to FIG. 17, the first metal gate electrode 350 and the first sacrificial layer 340 may be planarized until the top surface of the first metal gate electrode 350 is leveled with the top surface of the interlayer dielectric layer 330. The process of planarizing the first metal gate electrode 350 and the first sacrificial layer 340 may be a chemical mechanical polishing process.

Figure 18:
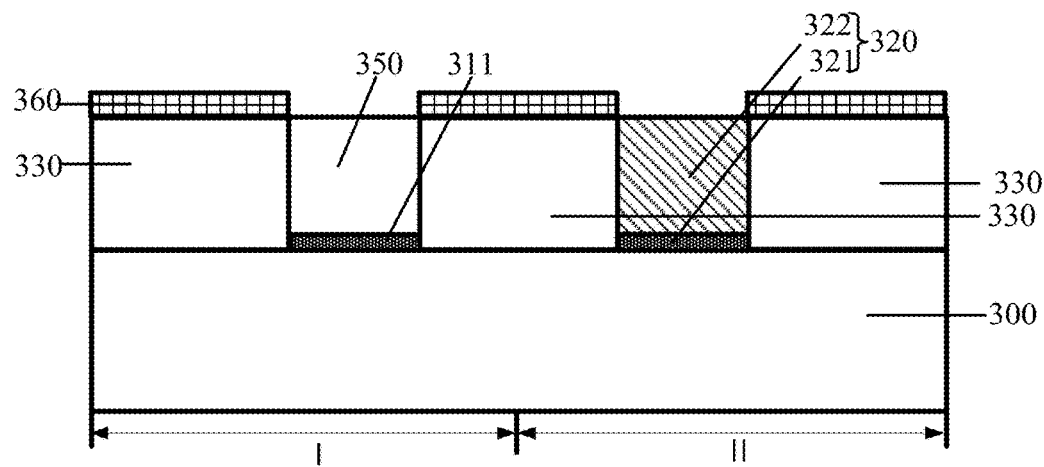

Returning to FIG. 24, after planarizing the first metal gate electrode and the first sacrificial layer, a second sacrificial layer may be formed (S306). FIG. 18 illustrates a corresponding semiconductor structure.

Referring to FIG. 18, after planarizing the first metal gate electrode 350 and the first sacrificial layer 340, a second sacrificial layer 360 covering the surface of the interlayer dielectric layer 330 may be formed by using the selective atomic layer deposition process. The process of forming the second sacrificial layer 360 can be referred to the process of forming the first sacrificial layer 340, and is not repeated herein.

Figure 19:
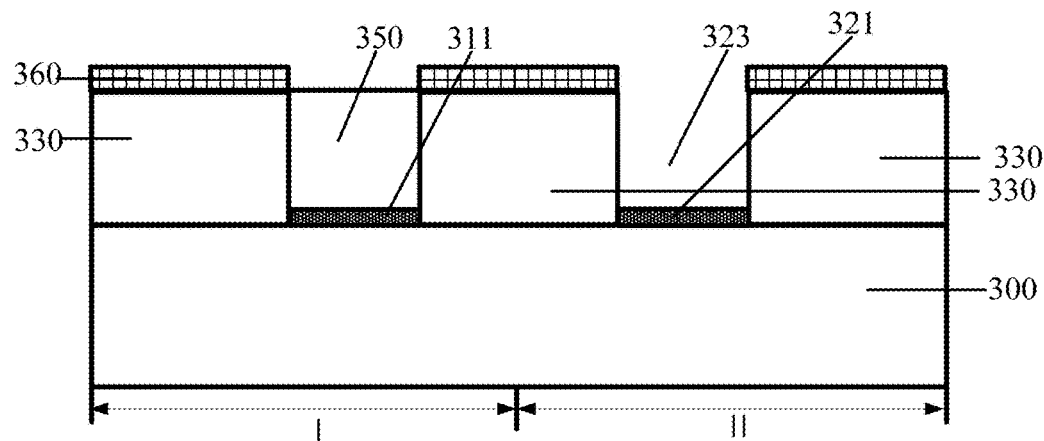

Returning to FIG. 24, after forming the second sacrificial layer, a second opening may be formed (S307). FIG. 19 illustrates a corresponding semiconductor structure.

Referring to FIG. 19, after forming the second sacrificial layer 360, a second opening 323 may be formed by removing the second dummy gate electrode 322. The process of removing the second dummy gate electrode 322 may be a dry etching process, or a wet etching process, etc.

Figure 20:
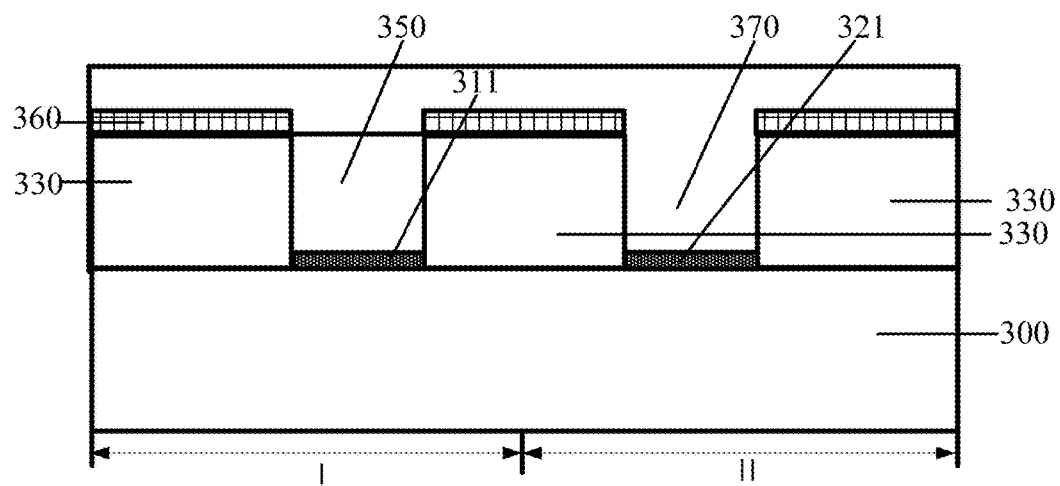

Returning to FIG. 24, after forming the second opening, a second metal gate electrode may be formed (S308). FIG. 20 illustrates a corresponding semiconductor structure.

Referring to FIG. 20, a second metal gate electrode 370 may be formed on the second sacrificial layer 360 and in the second opening 323. The second metal gate electrode 370 may be made of metal, including one or more of W, Al, Ti, Cu, Mo, and Pt. The process of forming the second metal gate electrode 370 may be a deposition process, or an electroplating process, etc. The entire surface of the second metal gate electrode 370 may be higher than the top surface of the second sacrificial layer 360.

Figure 21:
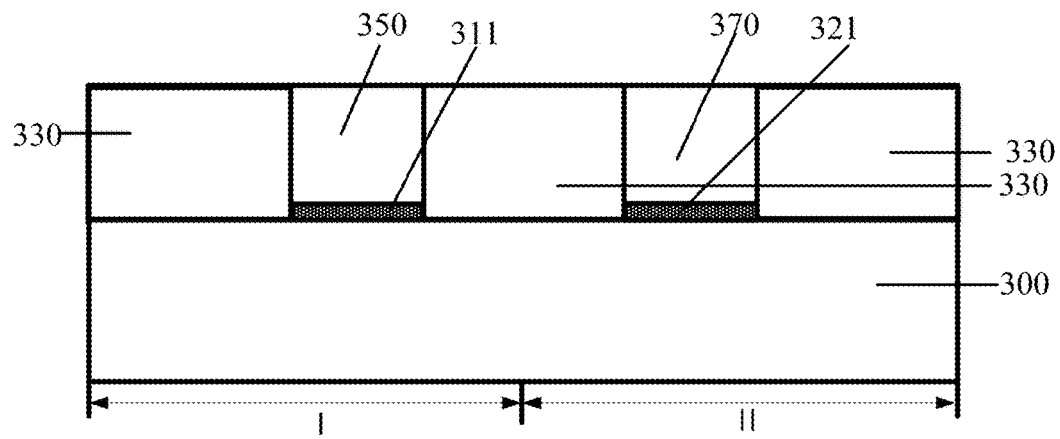

Returning to FIG. 24, after forming the second metal gate electrode, the second metal gate electrode and the second sacrificial layer may be planarized (S309). FIG. 21 illustrates a corresponding semiconductor structure.

Referring to FIG. 21, the second metal gate electrode 370 and the second sacrificial layer 360 may be planarized until the top surface of the second metal gate electrode 370 is leveled with the top surface of the interlayer dielectric layer 330. The process of planarizing the second metal gate electrode 370 and the second sacrificial layer 360 may be a chemical mechanical polishing process.

In one embodiment, because the first sacrificial layer covering the top surface of the interlayer dielectric layer may be formed by using the selective atomic layer deposition process, the first sacrificial layer may expose the top surfaces of the first dummy gate electrode and the second dummy gate electrode. Therefore, during the process of removing the first dummy gate electrode, the first sacrificial layer can protect the top surface of the interlayer dielectric layer from being damaged by the etching, so as to prevent the height of the interlayer dielectric layer from being decreased and changed during the process of removing the first dummy gate electrode. After planarizing the first metal gate electrode and the first sacrificial layer, the top surface of the first metal gate electrode may be leveled with the top surface of the interlayer dielectric layer. Because the height of the interlayer dielectric layer may not be changed, the height of the first metal gate electrode may not be changed either. Because the second sacrificial layer covering the top surface of the interlayer dielectric layer may be formed by using the selective atomic layer deposition process, the second sacrificial layer may expose the top surfaces of the first metal gate electrode and the second dummy gate electrode. Therefore, during the process of removing the second dummy gate electrode, the second sacrificial layer can protect the top surface of the interlayer dielectric layer from being damaged by the etching, so as to prevent the height of the interlayer dielectric layer from being decreased and changed during the process of removing the second dummy gate electrode. After planarizing the second metal gate electrode and the second sacrificial layer, the top surface of the second metal gate electrode may be leveled with the top surface of the interlayer dielectric layer. Because the height of the interlayer dielectric layer may not be changed, the height of the second metal gate electrode may not be changed either. Therefore, the heights of the finally formed first metal gate electrode and second metal gate electrode can be controlled.

In one embodiment, before forming the first metal gate electrode, optionally, a first barrier layer covering the first gate dielectric layer and a first working function layer covering the first barrier layer may be formed. Before forming the second metal gate electrode, optionally, a second barrier layer covering the second gate dielectric layer and a second working function layer covering the second barrier layer may be formed.

Accordingly, the selective atomic layer deposition process may be performed to form the sacrificial layer covering the top surface of the interlayer dielectric layer. Forming the sacrificial layer on the top surface of the interlayer dielectric layer and not forming the sacrificial layer on the top surface of the dummy gate electrode can be achieved in one single process step, simplifying the process of forming the sacrificial layer. In addition, because the sacrificial layer may be formed, the sacrificial layer can protect the top surface of the interlayer dielectric layer from being damaged by the etching, so as to prevent the height of the interlayer dielectric layer from being decreased and changed during the process of removing the dummy gate electrode. After planarizing the metal gate electrode and the sacrificial layer, the top surface of the metal gate electrode may be leveled with the top surface of the interlayer dielectric layer. Because the height of the interlayer dielectric layer may not be changed, the height of the metal gate electrode may not be changed either. Therefore, the height of the finally formed metal gate electrode can be controlled.

Further, the hydrogen radical treatment may be performed on the interlayer dielectric layer and the dummy gate electrode when forming the sacrificial layer by using the selective atomic layer deposition process, and it may be difficult to form the non-conductive silicon oxide layer on the top surface of the dummy gate electrode. Therefore, the top surface of the dummy gate electrode and the top surface of the interlayer dielectric layer may exhibit different electrical conductivities, and the precursor may be easily adsorbed on the top surface of the interlayer dielectric layer and be reacted to form the sacrificial layer. During each selective atomic layer deposition reaction, by controlling the thickness of the formed sacrificial layer, forming the sacrificial layer on the top surface of the dummy gate electrode and not forming the sacrificial layer on the top surface of the interlayer dielectric layer can be achieved. Therefore, the sacrificial layer can be selectively formed on the top surface of the interlayer dielectric layer, instead of being formed on the top surface of the dummy gate electrode.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a base substrate including a dummy gate electrode and an interlayer dielectric layer covering a sidewall of the dummy gate electrode;
   forming a sacrificial layer covering a top surface of the interlayer dielectric layer by using a selective atomic layer deposition process,
   wherein the sacrificial layer exposes a top surface of the dummy gate electrode,
   wherein the selective atomic layer deposition process comprises:
      performing a hydrogen radical treatment on the interlayer dielectric layer and the dummy gate electrode, the hydrogen radical treatment causing the top surface of the dummy gate electrode to absorb the hydrogen radical and have a different electrical conductivity from the top surface of the interlayer dielectric layer, wherein parameters of the hydrogen radical treatment include a gas, the gas comprising methane gas or hydrogen gas;
      introducing a first precursor into a reaction chamber to be absorbed on the interlayer dielectric layer;
      introducing a second precursor into the reaction chamber to react with the first precursor to form the sacrificial layer on the interlayer dielectric layer after the hydrogen radical treatment; and
      removing by-products after the reaction;
   forming an opening by using the sacrificial layer as an etch mask to remove the dummy gate electrode;
   forming a metal gate electrode on the sacrificial layer and in the opening; and
   planarizing the metal gate electrode and the sacrificial layer until a top surface of the metal gate electrode is levelled with the top surface of the interlayer dielectric layer.

2. The method according to claim 1, wherein:
   the top surface of the interlayer dielectric layer is levelled with a top surface of the dummy gate electrode.

3. The method according to claim 1, wherein:
   a thickness of the sacrificial layer is in a range of approximately 20 Å-100 Å.

4. The method according to claim 1, wherein:
   the sacrificial layer is made of tantalum nitride, or cobalt nitride.

5. The method according to claim 1, wherein parameters of the hydrogen radical treatment further include:
   a process time in a range of approximately 5 seconds-40 seconds; and
   a process temperature in a range of approximately 50° C.-400° C.

6. The method according to claim 1, wherein, when the sacrificial layer is made of tantalum nitride, reaction parameters of the first precursor and the second precursor include:
   the first precursor and the second precursor including $NH_3$ and $Ta(NMe_2)_5$;
   a temperature in a range of approximately 100° C.-300° C.; and
   a chamber pressure in a range of approximately 1 Torr-10 Torr.

7. The method according to claim 1, wherein, when the sacrificial layer is made of cobalt nitride, reaction parameters of the first precursor and the second precursor include:
   the first precursor and the second precursor including $C_7H_5CoO_2$ and $NH_3$;
   a temperature in a range of approximately 100° C.-300° C.; and a chamber pressure in a range of approximately 1 Torr-10 Torr.

8. The method according to claim 1, wherein:
a process of removing the dummy gate electrode is a dry etching process, or a wet etching process.

9. The method according to claim 1, wherein:
the metal gate electrode is made of a metal, including one or more of W, Al, Ti, Cu, Mo, and Pt.

10. The method according to claim 1, wherein:
a process of forming the metal gate electrode is a deposition process, or an electroplating process.

11. The method according to claim 1, wherein:
an entire surface of the metal gate electrode in the opening is above the sacrificial layer before planarizing the metal gate electrode.

12. The method according to claim 1, further including:
forming a source region in the base substrate at one side of the dummy gate electrode; and
forming a drain region in the base substrate at other side of the dummy gate electrode.

13. The method according to claim 1, before forming the metal gate electrode, further including:
forming a barrier layer on a gate dielectric layer; and
forming a working function layer on the barrier layer.

14. A method for fabricating a semiconductor device, comprising:
providing a base substrate including a first dummy gate electrode in a first region, a second dummy gate electrode in a second region, and an interlayer dielectric layer formed on sidewalls of the first dummy gate electrode and the second dummy gate electrode, and having a top surface coplanar with the first dummy gate electrode and the second dummy gate electrode;
forming a first sacrificial layer on a top surface of the interlayer dielectric layer by using a first selective atomic layer deposition process,
wherein the first sacrificial layer exposes a top surface of the first dummy gate electrode,
wherein the first selective atomic layer deposition process comprises:
performing a hydrogen radical treatment on the interlayer dielectric layer and the dummy gate electrode, the hydrogen radical treatment causing the top surface of the dummy gate electrode to absorb the hydrogen radical and have a different electrical conductivity from the top surface of the interlayer dielectric layer, wherein parameters of the hydrogen radical treatment include a gas, the gas comprising methane gas or hydrogen gas;
introducing a first precursor into a reaction chamber to be absorbed on the interlayer dielectric layer;
introducing a second precursor into the reaction chamber to react with the first precursor to form the sacrificial layer on the interlayer dielectric layer after the hydrogen radical treatment; and
removing by-products after the reaction;
forming a first opening by removing the first dummy gate electrode after forming the first sacrificial layer;
forming a first metal gate electrode on the first sacrificial layer and in the first opening;
planarizing the first metal gate electrode and the first sacrificial layer until a top surface of the first metal gate electrode is levelled with the top surface of the interlayer dielectric layer;
forming a second sacrificial layer covering the top surface of the interlayer dielectric layer by using a second selective atomic layer deposition process after planarizing the first metal gate electrode and the first sacrificial layer;
forming a second opening by removing the second dummy gate electrode after forming the second sacrificial layer;
forming a second metal gate electrode on the second sacrificial layer and in the second opening; and
planarizing the second metal gate electrode and the second sacrificial layer until a top surface of the second metal gate electrode is levelled with the top surface of the interlayer dielectric layer.

15. The method according to claim 14, wherein:
a thickness of the first sacrificial layer is in a range of approximately 20 Å-100 Å,
a thickness of the second sacrificial layer is in a range of approximately 20 Å-100 Å.

16. The method according to claim 14, wherein:
the first sacrificial layer is made of tantalum nitride, or cobalt nitride,
the second sacrificial layer is made of tantalum nitride, or cobalt nitride.

17. A semiconductor device, comprising:
a substrate;
a metal gate electrode structure on the substrate; and
an interlayer dielectric layer on the substrate and covering a sidewall of the metal gate electrode, wherein the metal gate electrode structure is formed by:
forming a sacrificial layer covering a top surface of the interlayer dielectric layer by using a selective atomic layer deposition process,
wherein the sacrificial layer exposes a top surface of the dummy gate electrode,
wherein the selective atomic layer deposition process comprises:
performing a hydrogen radical treatment on the interlayer dielectric layer and the dummy gate electrode, the hydrogen radical treatment causing the top surface of the dummy gate electrode to absorb the hydrogen radical and have a different electrical conductivity from the top surface of the interlayer dielectric layer, wherein parameters of the hydrogen radical treatment include a gas, the gas comprising methane gas or hydrogen gas;
introducing a first precursor into a reaction chamber to be absorbed on the interlayer dielectric layer;
introducing a second precursor into the reaction chamber to react with the first precursor to form the sacrificial layer on the interlayer dielectric layer after the hydrogen radical treatment; and
removing by-products after the reaction;
forming an opening by using the sacrificial layer as an etch mask to remove the dummy gate electrode; forming a metal gate electrode on the sacrificial layer and in the opening; and
planarizing the metal gate electrode and the sacrificial layer until a top surface of the metal gate electrode is levelled with the top surface of the interlayer dielectric layer.

18. The semiconductor device according to claim 17, further including:
a barrier layer on a gate dielectric layer; and
a working function layer on the barrier layer.

19. The method according to claim 14, wherein:
the first metal gate electrode is made of a metal, including one or more of W, Al, Ti, Cu, Mo, and Pt, the second metal gate electrode is made of a metal, including one or more of W, Al, Ti, Cu, Mo, and Pt.

20. The method according to claim 14, wherein:
a process of forming the first metal gate electrode is a deposition process, or an electroplating process,
a process of forming the second metal gate electrode is a deposition process, or an electroplating process.

* * * * *